United States Patent [19]

Pfeiffer et al.

[11] Patent Number: 5,674,413

[45] Date of Patent: Oct. 7, 1997

[54] SCATTERING RETICLE FOR ELECTRON BEAM SYSTEMS

[75] Inventors: Hans Christian Pfeiffer; Werner Stickel, both of Ridgefield, Conn.

[73] Assignee: International Business Machines Corporation, Armonk, N.Y.

[21] Appl. No.: 562,252

[22] Filed: Nov. 22, 1995

Related U.S. Application Data

[63] Continuation of Ser. No. 173,304, Dec. 23, 1993, abandoned.

[51] Int. Cl.$^6$ .................................................. G03F 9/00
[52] U.S. Cl. .................................... 219/121.25; 430/5
[58] Field of Search .................... 219/121.25, 121.26, 219/121.27, 121.28, 121.29, 121.3; 250/492.2, 492.22, 492.3, 396 R, 396 ML, 397, 398; 430/5, 296

[56] References Cited

U.S. PATENT DOCUMENTS

| | | | |
|---|---|---|---|
| 4,140,913 | 2/1979 | Anger et al. | 250/492 A |
| 4,243,866 | 1/1981 | Pfeiffer et al. | |
| 4,376,249 | 3/1983 | Pfeiffer et al. | 250/396 ML |
| 4,544,846 | 10/1985 | Langner et al. | 250/396 ML |
| 4,577,111 | 3/1986 | Saitou et al. | 250/492.2 |
| 4,621,371 | 11/1986 | Gotou et al. | 250/492.2 |
| 4,780,382 | 10/1988 | Stengl et al. | 430/5 |
| 4,855,197 | 8/1989 | Zapka et al. | 430/5 |
| 5,036,209 | 7/1991 | Kataoka et al. | 250/492.2 |
| 5,105,089 | 4/1992 | Yamada | 250/492.2 |
| 5,260,151 | 11/1993 | Berger et al. | 430/5 |
| 5,308,991 | 5/1994 | Kaplan | 250/492.22 |
| 5,364,718 | 11/1994 | Oae et al. | 430/5 |

OTHER PUBLICATIONS

Bohlen et al., "High Throughout Submicron Lithography with Electron Beam Proximity Printing", Solid State Technology, Sep. 1984, pp. 210–217.

Berger et al., "New approach to projection–electron lithography with demonstrated 0.1 µm linewidth", Appl. Phys. Lett. 57(2), 9 Jul. 1990, pp. 153–155.

Liddle et al., "Mask fabrication for projection electron–beam lithography incorporating the SCALPEL technique", J. Vac. Sci. Technol.B, 9 (6), Nov./Dec. 1991, pp. 3000–3004.

Berger et al., "Projection electron–beam lithography: A new approach", J. Vac. Sci. Technol.B, vol. 9, No. 6, Nov./Dec. 1991, pp. 2996–2999.

Primary Examiner—Teresa J. Walberg
Assistant Examiner—Gregory L. Mills

[57] ABSTRACT

A reticle for an electron beam system for direct writing applications has a base layer that contains a reticle pattern; a set of reinforcing struts connected to the base layer separating the base layer into a set of non-contiguous subfields; in which the pattern is carried by a set of apertures in said base layer; and in which the base thickness is set such that the probability that an electron traversing said base thickness will suffer a collision that removes it from the beam is greater than 90% while the probability that the electron will be absorbed is low; and in which, optionally, selected subfields of the reticle are compensated for errors in the remainder of the system.

6 Claims, 5 Drawing Sheets

SCATTERING RETICLE FOR ELECTRON BEAM SYSTEMS

The application is a continuation, of application Ser. No. 08/173,304, filed Dec. 23, 1993 now abandoned.

TECHNICAL FIELD

The field of the invention is that of direct-write electron beam systems for forming patterns on an integrated circuit wafer, in particular the field of reticles suitable for use in such systems.

BACKGROUND ART

The classic e-beam system is a "probe-forming" system in which a narrow beam that is the image of the electron source and has a gaussian distribution is scanned over the wafer or other target by an amount equal to a "pixel" at a time, the pixel being defined as the full width at half height of the intensity distribution. Such "Gaussian" systems have the highest spatial resolution, but lowest throughput of all probe forming systems due to the serial exposure of patterns one pixel at a time. They have, however, the advantage that corrections can be applied dynamically and pixel by pixel to compensate for aberrations of the electron lenses and deflection units in the system.

The highest throughput is obtained with a projection system that projects all pixels in parallel. The classic e-beam projection system is modelled on optical projection systems. In the foreseeable future, chips may have a size of approximately 17 mm×35 mm, so that at a typical 4:1 demagnification ratio, the reticle will have a size of 70 mm×140. Current technology is unable to produce an electron lens that will cover that size reticle with an acceptable fidelity at a nominal device groundrule corresponding to 0.25 μm or smaller critical dimension.

Throughput is essential if e-beam systems are to compete with light optical and X-ray systems. Therefore, reticle projection would be the technique of choice for wafer exposure. A key requirement for high throughput is, of course, a highly intense beam. High power means great heat load on the reticle, since a great deal of energy is deposited in the reticle by inelastic scattering and/or absorption, which would lead to intolerable distortion or even damage of the reticle.

An alternative approach to minimize thermal distortion of the reticle of a projection system is that of using a scattering reticle, as described in S.D. Berger & J. M. Gibson, APPL. PHYS. LETTERS 57 (2) (1990) 153), instead of an absorbing reticle. A scattering reticle requires an aperture above the wafer that preferentially absorbs scattered radiation having a greater scattering angle, thus translating scattering contrast into intensity contrast on the wafer. Scattering reticles suffer from a lack of contrast since there is considerable scattering in all portions of the reticle.

Consequently, there is a need a reticle for an e-beam system that would offer an acceptable tradeoff between adequate contrast and generating a low heat load.

SUMMARY OF THE INVENTION

The invention relates to an electron beam system for direct writing applications that combines the parallel pixel throughput of projection systems with the stitching capability of probe-forming systems, in which a base layer contains a reticle pattern; a set of reinforcing struts connected to the base layer separates the base layer into a set of non-contiguous subfields; the pattern is carried by a set of apertures and scattering regions in the base layer; and the base thickness is set such that the probability that an electron traversing said base thickness will suffer an elastic collision (a collision that scatters it out of the angular acceptance of the system is greater than 90%.

A feature of the invention is the ability to make corrections on each subfield of the reticle to compensate for a variety of errors in remainder of the system.

BEST MODE OF CARRYING OUT THE INVENTION

Figure 1:
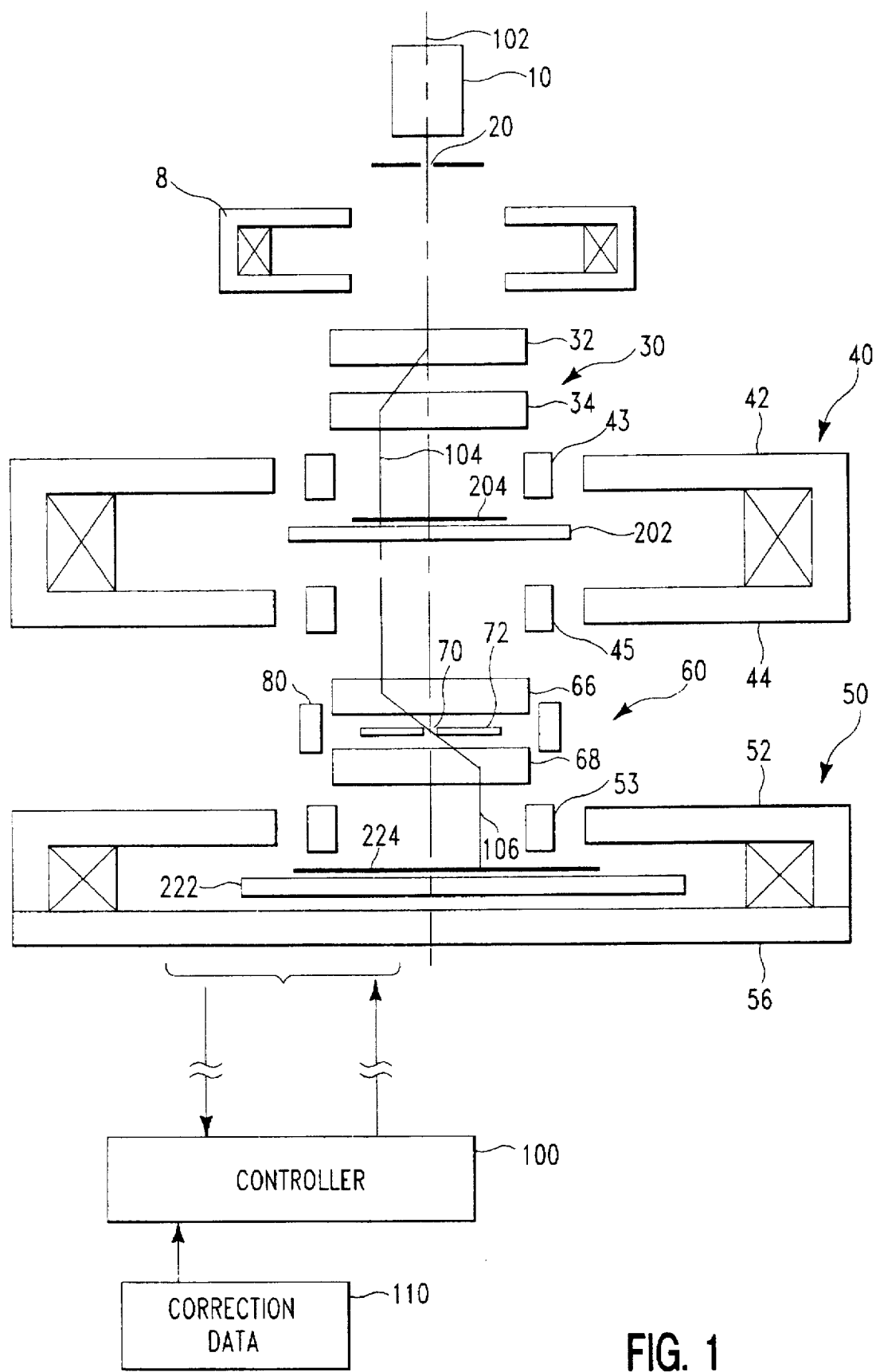
FIG. 1 illustrates in partially pictorial, partially schematic style, an e-beam system for use with the invention.

Referring now to FIG. 1, there is shown in partially pictorial, partially schematic form, an electron beam system employing an embodiment of the invention. At the top of the drawing, electron gun source 10 emits a diverging beam of electrons at a nominal energy of 100 kev downwardly in the Z direction along system axis 102 through illuminating aperture 20, having a nominal dimension of 1 mm square in this example. The aperture size is chosen so that the electron distribution across this aperture is uniform within limits such that the intensity variation across the subfield on the wafer is acceptable. Typically, the uniformity limit is about 2% for e-beam systems. After passing through aperture 20, the beam is collimated (rendered parallel) by a conventional magnetic lens 8 acting as a condenser.

In order to accommodate the system demand for a very large field, the beam will be scanned in steps sequentially across the surface of reticle 204. The beam is deflected by conventional deflection means 32 and 34 which have the capability to shift the beam parallel to the Z-axis in the X direction (left and right in the drawing) and/or in the Y direction (in and out of the plane of the paper). The beam extends downward along second axis 104, (for convenience, the beam axis at the nth subfield of the reticle will be referred to as the "reticle axis"), through a first variable axis lens denoted generally by the numeral 40 and having upper and lower pole pieces 42 and 44. Axis shifting yokes 43 and 45 (referred to generally as axis-shifting means) superimpose their fields over the lens fields generated between the pole pieces 42 and 44 so that the combined fields are azimuthally symmetric about axis 104 in a region larger than the beam, as is taught in U.S. Pat. No. 4,376,249. With this arrangement, off-axis aberrations introduced by the lens are substantially reduced, thereby permitting the use of a large scan field that may exceed 10 mm. Lenses of this type are referred to as variable axis lenses (VAL), since the optical axis of the lens is controllably shifted. The use of variable axis lenses provides high resolution electronic scanning of the reticle and wafer areas, which is complemented by mechanical scanning of the reticle and wafer as required to cover the entire chip real estate.

Beam 104 is focused onto reticle 204 by the upper part of lens 40, thereby creating an image of aperture 20 on the reticle coincident in size with a reticle subfield. Beam 104 strikes the nth subfield of the reticle 204 and passes along the Z axis through the bore of pole piece 44. As it passes through the reticle, the beam is patterned with the information contained in the subfield. In the case of a conventional absorbing reticle, the beam will be essentially absorbed in thick opaque areas and pass undisturbed through open areas. Ring-shaped ("doughnut") patterns in which an isolated solid area is surrounded by space are sequentially exposed in super-position of complementary reticles to compose the desired features as described in H. Bohlen et al., Solid state technol., Sep. (1984) 210).

The lower portion of lens 40 again collimates the beam in this example and, together with deflector 66, directs the beam to contrast aperture 70 that performs several functions as described below. Preferably the beam is collimated in the space between lens 40 and lens 50, in order to reduce interactions between the electrons. Collimation is not required and the term "operating on" the beam will be used to cover collimating, focusing and defocusing. The lower part of lens 40 in conjunction with the preceding lenses including the upper portion of lens 40 focuses an image of source 10 on aperture 70 as well as collimating the image of the reticle. Those skilled in the art will readily understand the constraints or element position and focal length imposed by this requirement.

It is an advantageous feature of the invention that the image of a subfield on the wafer may be translated from the position where a full-chip projection system would place it. Thus, the subfields of the reticle can be projected by the system onto the wafer essentially independently of each other. Consequently, the requirements to be placed on the reticle regarding accuracy and stability can be drastically reduced, as the system can provide small corrections for the position of each subfield before and even during exposure. Additionally, the reticle can have pre-distorted features that compensate for any remaining distortion in the electron optics. Furthermore, the capability of applying corrections on a subfield basis (a key advantage of probe-forming systems) eliminates the need for the reticle pattern to be contiguous over the entire chip area. Consequently, a stronger reticle can be used in which the subfields are physically separated and reinforcing struts are used to support the reticle and to resist the distorting effects of the heat absorbed by the reticle such as that illustrated in S. D. Berger et al., J. Vac. Sci. & Technol. B 9 (6)(1991) 2996; or in J. A. Liddle et al., Ibid., P. 3000). The subfields on the wafer are adjusted in position in the X-Y plane so that they are contiguous, using the stitching capability of the system.

Deflectors 66 and 68 perform a translation inverse to that done above reticle 204 to bring beam 104 back to system axis 102 at aperture 70 and then to bend the beam to final beam 106 ( for convenience, the beam axis at the nth subfield image on the wafer will be referred to as the "wafer axis"), travelling parallel to axis 102 and on the opposite side from beam 104. The point at which the beam crosses axis 102 will be referred to as the pivot point because the beam pivots through that point as it images various subfields. Variable axis immersion lens (VAIL) 50 together with the lower half of variable axis lens 40 focuses beam 106 on to wafer 224, generating a demagnified image on the wafer of the pattern contained in the reticle subfield. Lens 50 is a particular form of VAIL in which a magnetically permeable plate 56 below wafer 224 provides a return path for the magnetic fields that focus the beam on wafer 224. in general, a VAIL can permit the beam to pass through. Lens 40 is also a VAIL, since reticle 204 is immersed in the field. It may be referred to either as a "dual" VAIL since it performs two focusing actions—one to focus a collimated beam on to reticle 204 and another to collimate the beam emerging from reticle 204, or it may be referred to as a "transmissive" VAIL, since it transmits the beam to the next element instead of stopping it.

The axis crossover makes possible some advantageous features of the invention. One skilled in the art would think that, having reduced off-axis aberrations with axis-shifting yokes 43 and 45, it would be sufficient to continue beam axis 104 all the way down to wafer 224, with only a minor correction in displacement to stitch together the subfields on the wafer. The addition of any elements invariably introduces aberration, since no element is perfect. Thus, one skilled in the art would prefer to have only a single offset axis and to avoid the use of additional elements such deflectors 66 and 68. The addition of deflectors 66 and 68 and the deflection through the pivot point, however, effectively decouples the two lens systems 40 and 50 from each other, so that each can have its own optical axis independently, with the beam staying on these respective variable axes.

A first advantage of this independence is that the beam can be steered at all times through one fixed pivot point on the symmetry axis 102 of the lens system at a location that can be chosen at will. Thus, there can be a single multi-purpose aperture 70 on the pivot point, instead of one aperture for each subfield. If the beam stayed on the same side of the system axis, an aperture plate containing one opening for each subfield would be required. This would not be practical because extremely stringent requirements for accuracy and stability comparable to those imposed on X-ray masks would have to be placed on such a multi-hole aperture plate under continuous high power electron bombardment. Aperture 70 has several purposes: to limit the image size of source 10 (by clipping the tails of the electron distribution); to block electrons strongly scattered in the reticle; to create image contrast at the target; and to provide a means to sense beam current for alignment and other corrections. Accordingly, it will be sometimes referred to as a multi-purpose aperture.

A second advantage is the ability to place elements for dynamic correction of aberrations (field curvature, astigmatism, distortion) symmetrically around the fixed pivot point, so that additional aberrations resulting from the scanning motion of the beam are minimized because the beam passes through the corrective elements concentrically.

Lens 40 is also referred to as an immersion lens, in analogy to optical lenses, since the object (the reticle) is immersed in the focussing field defining the lens. Immersion is not required, and both the physical location along the Z-axis and the shape of the fields may be tailored. The reticle is not required to be placed exactly on the symmetry plane of lens 40 as shown in FIG. 1. Since the lower part of lens 40, in conjunction with lens 50, provides the overall demagnification of the system, a different axial position of the reticle may be chosen to optimize the overall system performance. For example, the reticle may be placed upstream and outside the field of lens 40, in which case both sections of lens 40 will act as one lens.

ELECTRICAL AND MECHANICAL SCANNING

The exposure process requires synchronization of 4 independent scanning motions:

1. Electrical beam scan on the reticle
2. Mechanical scan of the reticle
3. Electrical beam scan on the wafer
4. Mechanical scan of the wafer Both electrical scans can be modified to correct for errors of the mechanical scans of reticle and wafer, and also to deliberately deviate from the mechanical scans to minimize overhead times at turn-around points.

Figure 2A:
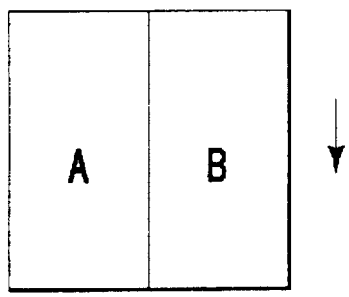
FIG. 2 illustrates the use of complementary reticles in the prior art.
Figure 2B:
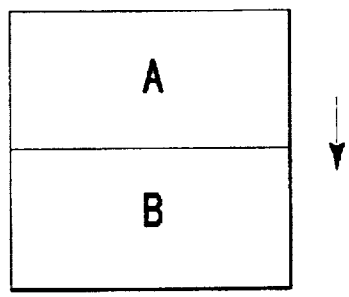

In FIG. 1, beam 104 steps over reticle 204 in the X direction illustratively from right to left in the figure (with beam 106 stepping over wafer 224 simultaneously from left to right), while the reticle and wafer are scanned mechanically in the y direction (in and out of the paper plane). The mechanical motion is not interrupted for exposures. Blurring of the image due to motion during exposure is avoided by deflecting the beam during the exposure (referred to as bucking the stage motion) to compensate for the stage motion. The scanning operation is illustrated in FIGS. 2A and 2B. FIG. 2A illustrates a top view of a chip having, say, 70 by 140 subfields showing a few rows (68, 69, 70) and columns. The beam is effectively limited to a small range in the Y dimension, say a few subfield rows, perpendicular to the X-Z plane. There is no need to scan the beam electrically by a large amount in the Y-direction, when a continuously moving stage is used, which accomplishes the result. However, x and y electrical scanning can be combined with a mechanical "step & repeat" motion in order to employ a deflection system having a smaller deflection than that illustrated here.

In the illustrative system, the problem of non-singly connected areas (doughnut shapes) is handled by the use of complementary reticle subfields that combine to produce the correct pattern. Referring now to FIG. 2, there are illustrated two versions of a prior art approach to the use of complementary reticles. In FIG. 2A, two complementary patterns together comprising a chip and each having an aspect ratio of about 2:1 are placed side by side. FIG. 2B shows an alternate layout. The fundamental disadvantage of both arrangements is the physical distance between corresponding pattern sections and the time delay between exposure of corresponding areas of pattern A and pattern B. Both these causes can lead to serious problems of alignment due to stage errors increasing with distance and various system drifts due to the charging of the reticle or to the reticle temperature increasing with time.

Figures 3A, 3B, 3C:
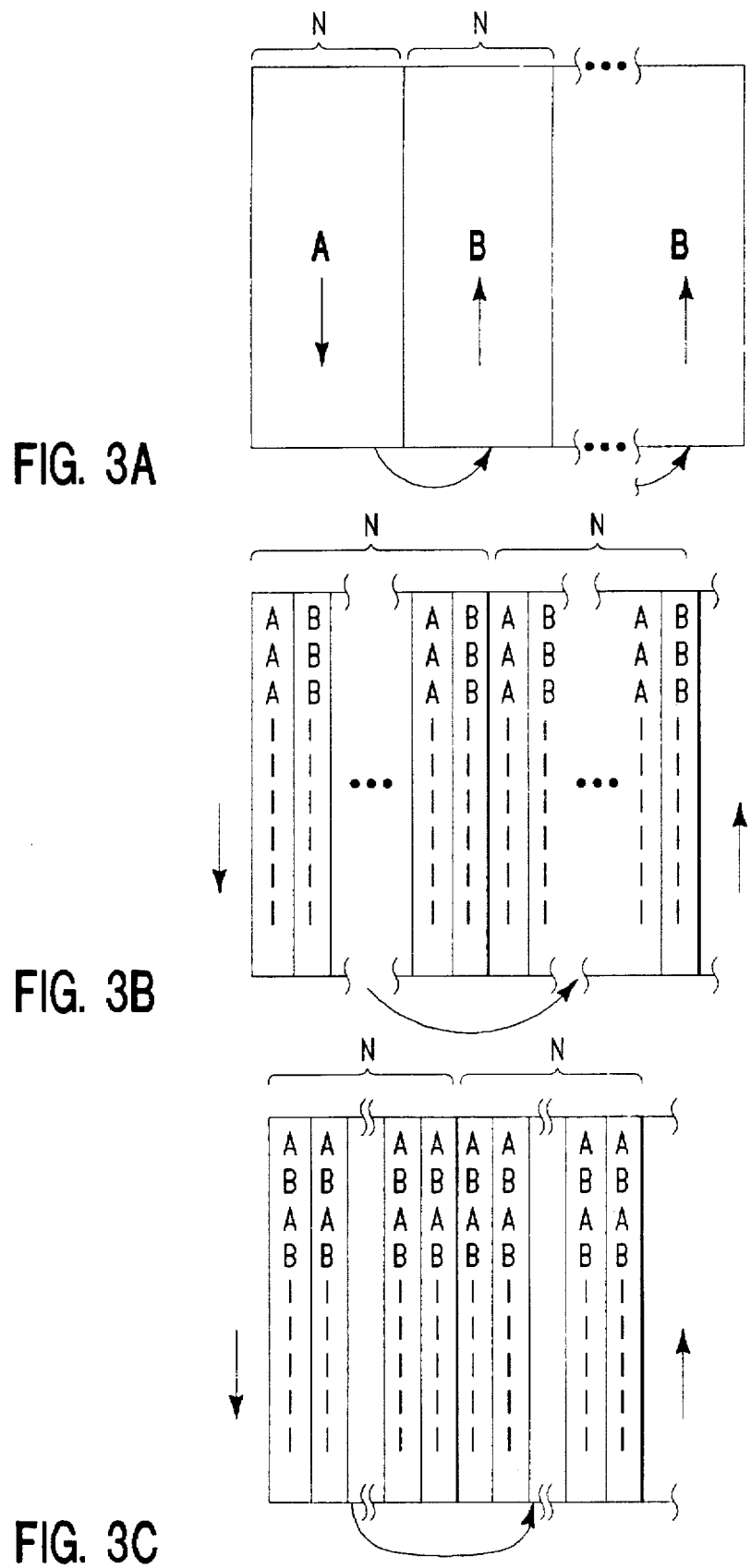
FIGS. 3A–3C illustrate different methods of positioning subfields on a reticle.

FIG. 3A illustrates an improvement to the prior art method in which the disadvantage of distance and time delay of combining patterns A and B is alleviated by placing stripes of A and B alternately next to each other, each having N subfields in a row. A stripe is defined in width by the scanning range of the beam deflection (illustratively 20 mm), and in length by the continuous motion in one direction of the stage. Preferably, the subfields are combined to form a combined reticle that is nearly square. The stage motion will always be along the longer dimension of the combined reticle in order to minimize the number of times that the reticle and the stage reverse direction. The arrows indicate the motion of the reticle stage, both travelling and shifting from one stripe to another. When stripe A is completely exposed, the reticle stage moves over to the adjacent stripe while the wafer stage only reverses direction. Stripe B is then exposed with reverse motion of both reticle and wafer stages. It is an advantage of this embodiment that the wafer stage moves in one axis only during the critical superposition of the complementary pattern portions. Preferably, subfields are located in the same sequence in adjacent complementary stripes, so that corresponding subfields are separated by N-1 subfields on the same row.

The following embodiments have the closest proximity of the two patterns. They therefore provide the best alignment and stability of the various embodiments. Both require deflection corrections to compensate for the fact that exposure of adjacent subfields will require beam motion on the reticle but no beam motion on the wafer; i.e. the motion on the reticle must be removed by the optics. This is facilitated by including within correction elements 80 an additional deflection similar to deflector 66 or 68 and oriented to correct for the beam displacement on the reticle. This device is a multi-purpose device that corrects for small deviations from other causes unrelated to the use of subfields; e.g. a mismatch between the scanning pivot point and the location of aperture 70.

Referring now to FIG. 3B, there is shown an embodiment in which single-subfield columns from A and B are interleaved in the direction of the beam scanning; i.e. the sequence along a row is ABAB—etc. For a scanning range of N subfields on the reticle there will now be N/2 subfields on the wafer that are completely exposed. The range of beam motion on the wafer will therefore be reduced by a factor of 2 compared to previous embodiments. This embodiment therefore has the advantage that there will be less deflection distortions in projection lens 50, since the beam will be closer to the axis. In this and the following embodiment, the wafer stage shifts from one stripe to another the same number of times as the reticle stage. This is not a disadvantage over embodiment FIG. 3A, as the reticle stage needs more time to turn-around than the wafer stage. The preferred embodiment is illustrated in FIG. 3C, in which rows from A and B having the full stripe width of N subfields are interleaved along the direction of mechanical scan (along the stripe). In this embodiment, the complementary reticles are preferably combined so that the stage motion is along the short sides of the complementary halves of the reticle (as in FIG. 2B). In this case, the amplitude of the beam motion bucking the stage motion at the reticle is increased by a factor of two. An advantage of this embodiment is the reduction of the wafer stage speed by 50%, with a consequent improvement in vibration and other problems associated with high speed stage motion. In this embodiment, the lengths of corresponding stripes on the reticle and the wafer are different by a factor of 8, rather than the optical reduction factor of 4.

Figure 4A:
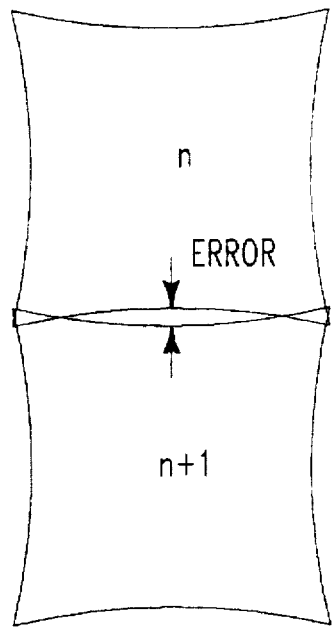
FIGS. 4A and 4B illustrate provisions for making connection in the overlap area of a subfield.

Referring now to FIG. 4, there is shown in FIG. 4A an enlarged portion of a wafer showing in exaggerated form the intersection of two adjacent subfields, n and n+1. Note that lines perpendicular to the edges of the common boundary will connect at the area in the corners because the subfields overlap there, but such lines will not meet in the center of the boundary. Conversely, lines parallel to the boundary may overlap and short out in the overlap region, while such parallel lines will have an extra margin of separation in the center area.

Figure 4B:
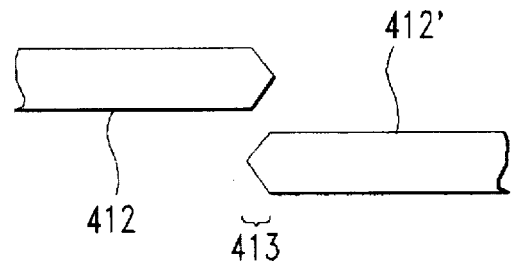

Referring now to FIG. 4B, a pair of lines 412 and 412' are shown that are intended to join at a subfield boundary. They are shown displaced in this figure for clarity. The corresponding feature on the reticle will be either a line or a space, depending on the polarity of the resist. Resists of both polarities are used in appropriate circumstances and the reticles will be designed accordingly. Bracket 413 indicates a nominal overlap that is designed into the subfields of the reticle. Subfields consist of a defined subfield region that covers the nominal subfield in question and an overlap region at the edge of the defined subfield region that overlaps the image of the adjacent subfield on the wafer even when the alignment is correct. For a nominal alignment error of 20 nm, the subfields should overlap by the distance 413 (illustratively 50 nm) in order to ensure that there are no gaps in connecting lines. Overexposure in the overlap area may be avoided by use of the techniques taught in copending patent application (D. E. DAVIS, Docket #F19-93-057) or by the use of triangular tips of corresponding elements. Complementary triangular tips having the length of the nominal overlap are formed at the ends of the lines at the boundaries of subfields. The example illustrated has a compromise angle of 45°, but those skilled in the art will readily be able to select different angles to suit their circumstances.

In scattering reticles, the reticle has a continuous low-Z layer and a high-Z layer covering the part of the pattern that is meant to be opaque. Intensity contrast is provided by discriminating electrons scattered in high-Z (having e.g. a gold film) areas and from those scattered in low-Z (e.g. silicon) areas. There is always considerable scattering from the low-Z areas because there is a minimum thickness that is required for strength, so that scattering reticles inherently have lower contrast than stencil reticles. Stencil reticles (absorbing reticles that absorb incident electrons in the opaque area) and scattering reticles represent two extremes of reticle design. The former suffers from problems associated with the heat load on the reticle. Also, if struts are not used in non-singly connected areas, then stencil reticles also require the use of complementary subfields as described above, so that twice as many subfields must be exposed. The latter suffers from a substantial loss of current at the contrast aperture even from the "transparent" areas of the reticle that is potentially commensurate to a double pass exposure associated with a stencil reticle. It will also have potential heat problems because of inelastic scattering in both the low and high-Z areas of the reticle.

Figure 5:
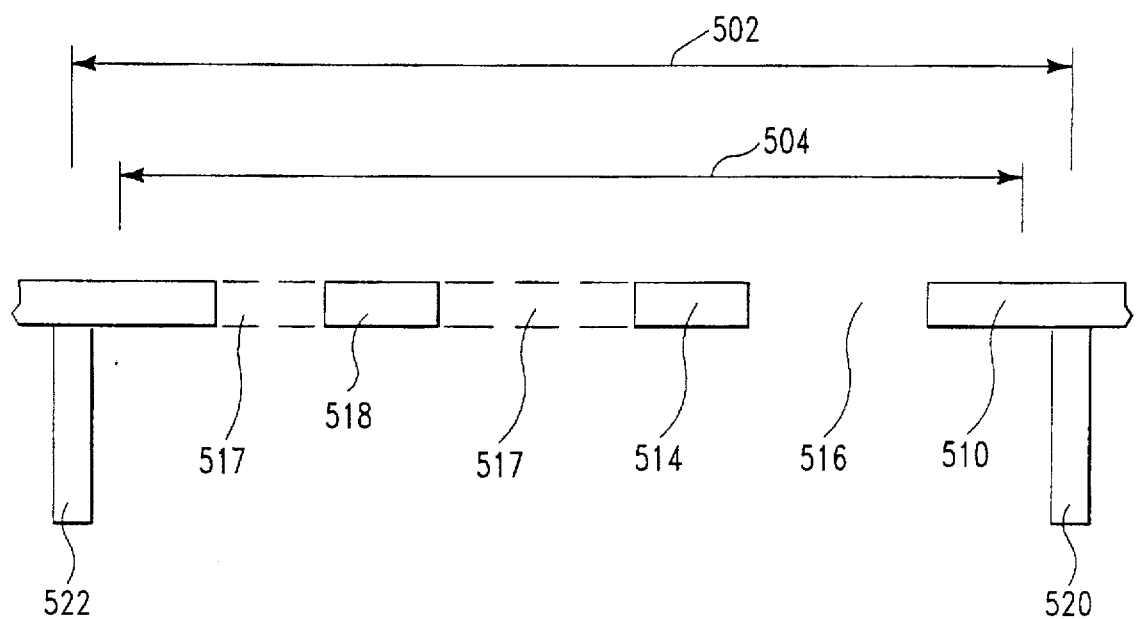
FIG. 5 illustrates a cross section of a reticle suitable for use with the invention.
Figure 6:
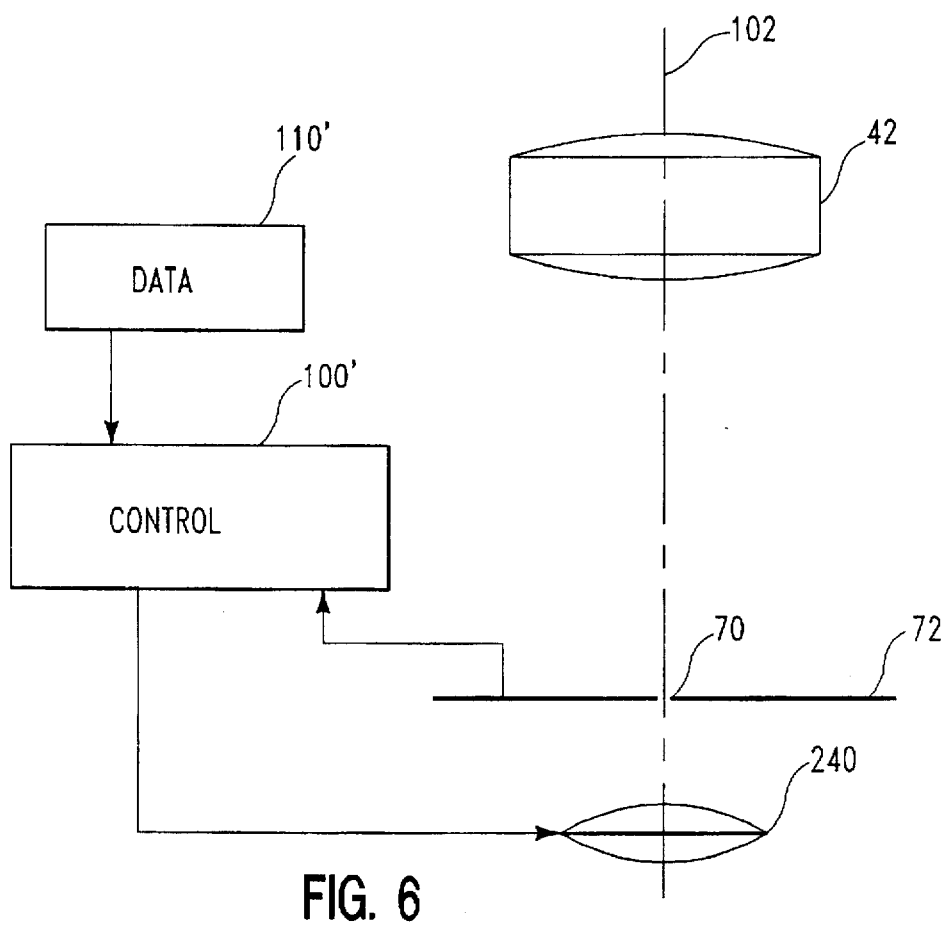
FIG. 6 illustrates a portion of a system having dynamic correction of subfields.

In FIG. 5, there is illustrated in cross section a reticle constructed according to the invention. Layer 510 carries the reticle pattern and is illustratively silicon. The thickness of layer 510 is set according to a multi-factor tradeoff to balance adequate scattering, the heat load on the reticle, the sensitivity of the photoresist and the optics of the system. The thickness has a minimum value ( referred to as the "threshold thickness") such that enough electrons are scattered at an angle large enough to be intercepted by the blocking plate (scattered at an angle greater than the acceptance angle of the system) so that the remaining electrons from a scattering region that pass through the aperture deliver an exposure that is less than the exposure threshold of the resist on the wafer (i.e. the residual dose from a scattering region that reaches the resist will not print in that area). Preferably, the probability of such a collision is greater than 90%. The tolerable amount of beam that gets through to the wafer will depend on the resist and further wafer processing and will routinely be set empirically. The thickness should be such that the reticle has a tolerable heat load. Preferably, the thickness is about an order of magnitude less than the range of electrons for that beam energy. For 100 key electrons striking silicon, this thickness is in the order of 1 µm and less than 5µm. Since the thickness of a conventional stencil reticle must be on the order of the electron range in order to absorb most or all of the electrons, the thickness of an absorbing stencil reticle must be much greater than the thickness of a reticle constructed according to the invention. Reticles constructed according to the invention have an advantage over differential scattering reticles that the silicon layer can be thicker, allowing for greater structural strength. In scattering reticles, the base layer of silicon (or silicon nitride) is used for the "transparent" or low-scattering areas and must be as thin as possible (on the order of 0.1 µm).

Reticles constructed according to the invention will thus be more robust than differential scattering reticles.

Struts 520 and 522 bracket the subfield illustrated. These struts are separated by a nominal distance indicated by the arrow labelled 502. The nominal usable dimension of the subfield is indicated by the arrow labelled 504 and is of the order of 1 mm in this example. Struts 520 have a nominal width and height of about 0.2 mm. Apertures 516, represented here in the common situation of a singly-connected area are openings in layer 510. They may be fabricated by conventional etching techniques. Such a reticle has the advantage over a "pure" or "differential" scattering reticle that it will cause less over-all scattering since there will be none in the openings, and the same scattering in the areas that scatter (referred to as the "scattering regions". The term "a pattern carried by apertures and scattering regions" is intended to cover both kinds of reticles—those in which a line on the wafer corresponds to a line on the reticle and those in which a line on the wafer corresponds to a space or aperture on the reticle. Solid lines 518 represent an isolated scattering region and dashed lines 517 represent the struts supporting region 518.

CALIBRATION AND ERROR CORRECTION

An advantageous feature of the present invention, combining as it does features of a probe-forming system with the projection technique, is that each subfield can be corrected for lens aberrations, thermal aberrations, errors in the mechanical transport, etc. A system will initially be calibrated both in the aberration for each subfield and also for the effects of thermal aberration from heat deposited by the beam in the course of operation. Correction factors can be applied to the reticle, subfield by subfield, to compensate for the distortions that are revealed in the calibration process.

CORRECTION ELEMENTS

Correction elements are required to correct for astigmatism, distortion of the undeflected subfield (that on axis 102), for field curvature, and for potential distortion changes of the deflected subfields (those off axis 102). Furthermore, compensation of space charge defocusing may be performed in real time. This compensation varies with the pattern-dependent average transparency of the subfields. It is an advantage of this invention that a different correction can be applied for each subfield. Initial calibration will generate a set of correction data that may be stored in storage unit 110 in FIG. 1. This unit may be a disk drive, random access memory or any other convenient form of storage. Controller 100, which may be a general purpose computer such a PS/2■ system from IBM, selects the appropriate correction factors and applies them to correction elements indicated schematically by the box labelled 80 in FIG. 1. Pre-exposure calibration of the space-charge defocusing (by reliable mapping) is less desirable than real-time correction for each subfield based on current measurement at the aperture at the beginning of each subfield exposure period. Conventional correction elements such as the "stigmators" described in electron optical textbooks and comprising at least a pair of quadrupole lenses are used to correct for astigmatism. Higher order multipoles such as hexapoles will also be employed to correct for subfield distortion. A conventional magnetic lens is used to correct for field curvature. Preferably, the correction elements are located in the plane of an image of the source between reticle and wafer, coincident with the location of multi-purpose aperture 70.

RETICLE PRE-DISTORTION

To compensate for deflection distortions of the system, the pattern of the reticle can be laid down pre-distorted in the opposite direction, provided of course, that the system distortions are known and invariant. For example, in the case of a non-linear residual barrel distortion in the optical system, the reticle would be pin-cushion shaped in the proper amount varying from subfield to subfield. For convenience in the attached claims, the term "displaced in non-linear distortion" will be taken to mean that the elements in that subfield are displaced relative to their position in an undistorted subfield in such a manner that the resultant distribution of elements is essentially the same as that produced by a non-linear distortion and having a magnitude sufficient to compensate for the corresponding non-linear distortion in the remainder of the system downstream from the reticle. In the example illustrated, pincushion distortion in the system is compensated by barrel distortion of the reticle. The same terminology will be used for linear distortion. Those skilled in the art are aware of many distortions in addition to those mentioned. However, no severe constraints would have to be placed on the allowable distortion regarding symmetry or polynomial order. Even non-linear distortions within a sub-field could thus be dealt with. Repetitive thermal distortion of the mask under beam irradiation can be corrected as well as reducing the requirements for global thermal distortion.

Figure 7A:
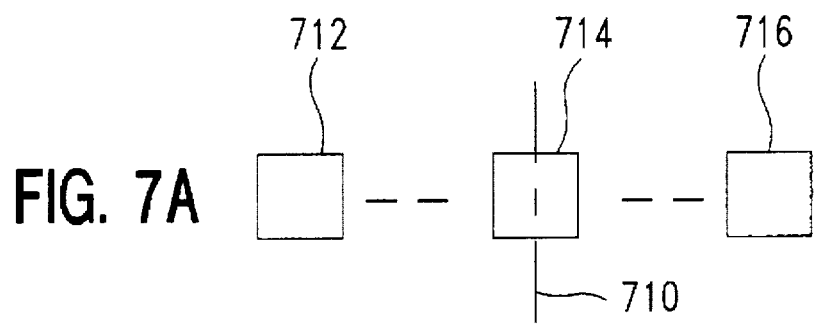
FIGS. 7A–7D illustrate predistortion of selected reticle subfields.
Figure 7B:
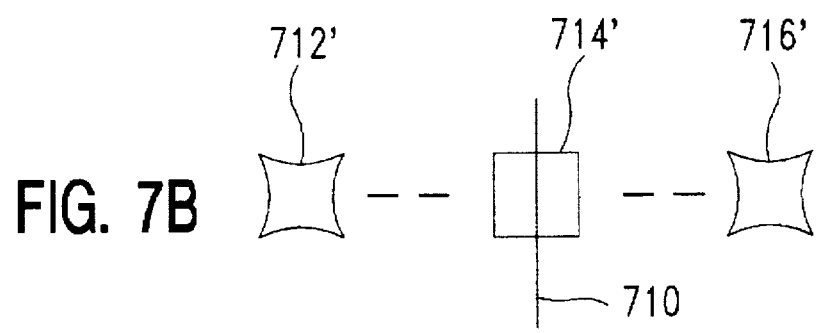
Figure 7C:
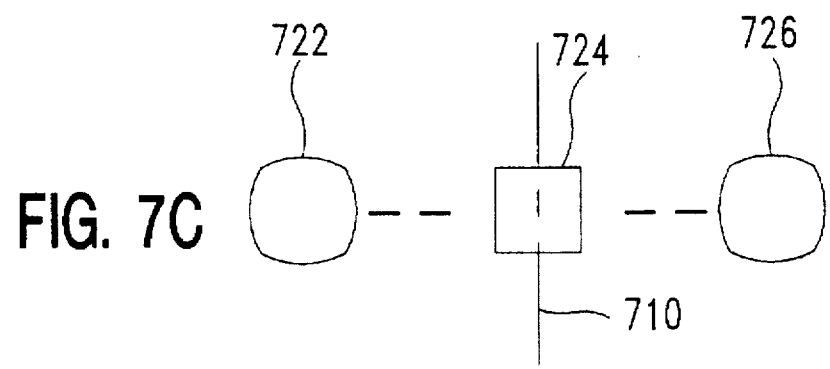
Figure 7D:
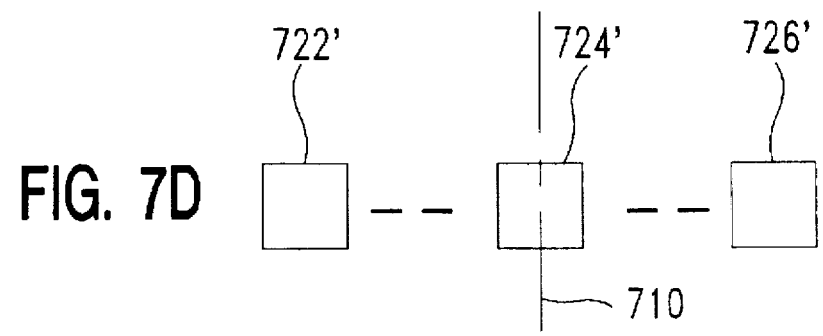

Third order distortions in the imaging and correction elements of the system can cause a square subfield in the reticle to appear pincushion distorted at the wafer. Implementing compensating barrel distortion of the subfield at the reticle eliminates the subfield distortions at the wafer. For example, FIG. 7A illustrates an uncorrected reticle that produces (FIG. 7B) pincushion distortion on the wafer. Subfields 712 and 716 (at outer positions on the row) produce distorted images on the wafer 712' and 716'. Subfield 714 at the center of the stripe on stripe axis 710 (the central subfield) is not affected because the effect is that of imperfect field correction across the subfield, while the correction is adequate at the center. Since the distortion varies across the subfield, it is not convenient to correct it dynamically in correction elements or elsewhere. Ordinarily, distortions that are uniform within a subfield may be more conveniently and flexibly corrected dynamically. The use of compensating barrel distortion on subfields 722 and 726 in FIG. 7C produces the desired result, shown in FIG. 7D of uniform images on the wafer.

An embodiment of the invention that eliminates the need for complementary patterns and thereby reducing the writing time by a factor of 2 uses bars or struts to support the inner shapes of multiply connected pattern features ("doughnut holes"). The struts are narrower than the minimum linewidth or critical dimension (CD) that the exposure tool can resolve (referred to as the critical dimension of the pattern), so that they do not appear in the demagnified image of the reticle pattern on the wafer. The struts must be separated from their nearest neighbors by more than the CD so that two or more images to not combine. Adequate strut width is available due to the fact that the struts are exposed as isolated spaces, the width of which is controlled by proper positioning of the surrounding larger exposed areas. Since the positioning accuracy is more precise than dimensional control, the system that makes the reticle need not have as great accuracy as the system that use the reticle to expose a wafer.

Those skilled in the art will readily be able to devise other embodiments of the invention than that illustrated and the scope of the following claims is not meant to be limited to the embodiments shown.

We claim:

1. A reticle for patterning an electron beam having a beam energy in an ebeam system comprising: a base layer of a base thickness and containing a reticle circuit pattern; a set of reinforcing struts connected to said base layer on a first side thereof and forming a strut pattern separating said base layer into a set of non-contiguous subfields, characterized in that:

said reticle circuit pattern is carried by a set of apertures and scattering regions in said base layer;

said set of non-contiguous subfields is comprised of two subsets of complementary subfields that are disposed in a plurality of parallel stripes, each having a stripe axis parallel to a mechanical scanning direction and having rows of N subfields disposed along said stripe axis where N is greater than 1; and adjacent stripes contain complementary subfields from said two subsets of complementary subfields, whereby each subfield is displaced from a complementary subfield on the same row.

2. A reticle according to claim 1, further characterized in that:

said base thickness is less than a threshold thickness.

3. A reticle according to claim 2, further characterized in that:

said subfields comprise a defined subfield and at least one overlap region adjoining an edge of said defined subfield and containing extensions of lines extending over said edge of said defined subfield, whereby images of said extensions on a target extend past the boundary of an image of said defined subfield and overlap an adjacent subfield image.

4. A reticle according to claim 1, further characterized in that:

elements within at least one subfield on an outer position of at least one row are displaced compared with elements at corresponding positions within a central subfield of said at least one row, whereby optical distortions within said system are compensated by said displacement.

5. A reticle according to claim 4, further characterized in that:

elements within at least one subfield on an outer position of at least one row are displaced in linear distortion of a magnitude sufficient to compensate for linear distortion in said system.

6. A reticle according to claim 4, further characterized in that:

elements within at least one subfield on an outer position of at least one row are displaced in non-linear distortion of a magnitude sufficient to compensate for non-linear distortion in said system.

* * * * *